United States Patent
Sasaki

(10) Patent No.: US 8,581,340 B2
(45) Date of Patent: Nov. 12, 2013

(54) SEMICONDUCTOR DEVICE OF WHICH BREAKDOWN VOLTAGE IS IMPROVED

(75) Inventor: Kenji Sasaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 5 days.

(21) Appl. No.: 13/189,860

(22) Filed: Jul. 25, 2011

(65) Prior Publication Data

US 2012/0025310 A1    Feb. 2, 2012

(30) Foreign Application Priority Data

Jul. 29, 2010  (JP) .................................. 2010-171078

(51) Int. Cl.
*H01L 29/66* (2006.01)

(52) U.S. Cl.
USPC ............... 257/336; 257/339; 257/E29.256; 257/E21.417; 438/163

(58) Field of Classification Search
USPC ........................ 257/336, E21.417, E29.256
See application file for complete search history.

(56) References Cited

U.S. PATENT DOCUMENTS

| | | | |
|---|---|---|---|
| 4,048,649 A * | 9/1977 | Bohn ............................. | 257/378 |
| 2007/0200184 A1* | 8/2007 | Zhu et al. ...................... | 257/409 |
| 2008/0308874 A1 | 12/2008 | Letavic et al. | |
| 2009/0302385 A1* | 12/2009 | Chu et al. ...................... | 257/343 |
| 2010/0032749 A1* | 2/2010 | Shrivastava et al. ........... | 257/328 |
| 2010/0237412 A1* | 9/2010 | Shrivastava et al. .......... | 257/336 |

FOREIGN PATENT DOCUMENTS

| | | |
|---|---|---|
| JP | 2008-535235 A | 8/2008 |
| WO | WO 2006/103634 A2 | 10/2006 |

* cited by examiner

*Primary Examiner* — Michelle Mandala
*Assistant Examiner* — Shaka White
(74) *Attorney, Agent, or Firm* — Foley & Lardner LLP

(57) ABSTRACT

A semiconductor device includes: a semiconductor substrate; a gate electrode formed on the semiconductor substrate through a gate insulating film; a source diffusion layer and a drain diffusion layer formed on both sides of the gate electrode, respectively, in the semiconductor substrate; and a field drain section formed below the gate electrode in the semiconductor substrate so as to be positioned between the gate electrode and the drain diffusion region and include an insulator. The field drain section includes: a first insulating film configured to be contact with the semiconductor substrate, and a second insulating film configured to be formed on the first insulating film and has a dielectric constant higher than a dielectric constant of the first insulating film.

18 Claims, 13 Drawing Sheets

(RELATIVE DIELECTRIC CONSTANT=3.9:SiO$_2$)

(RELATIVE DIELECTRIC CONSTANT=6.0:p-SiN)

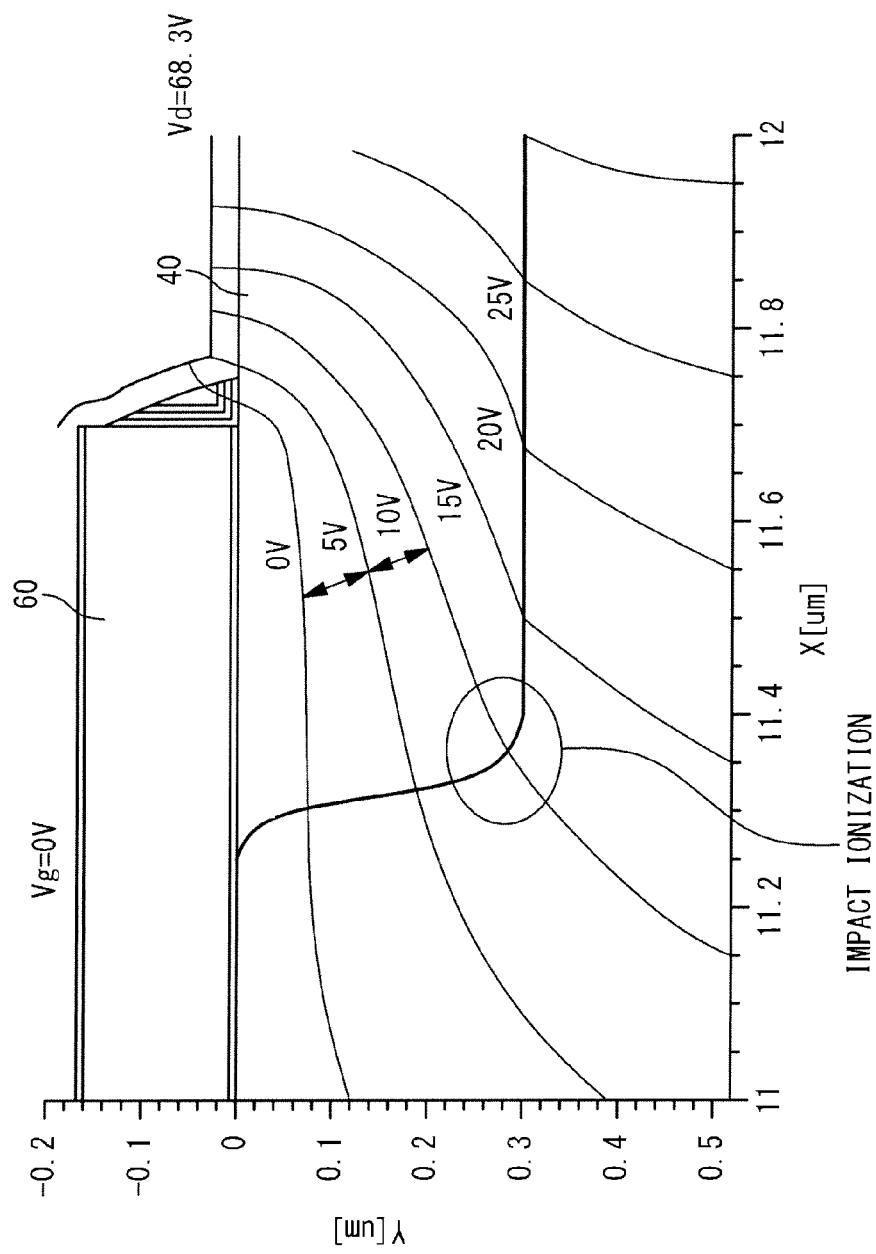

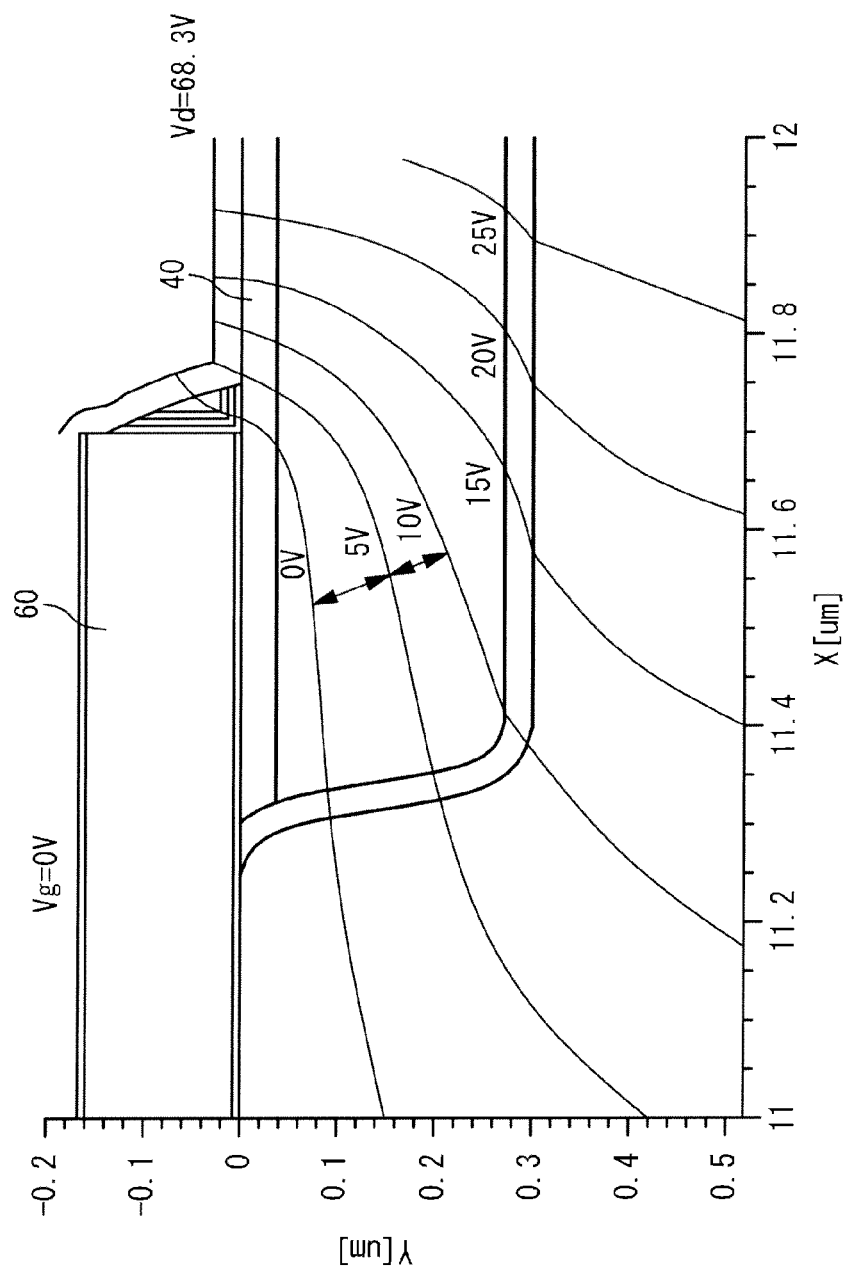

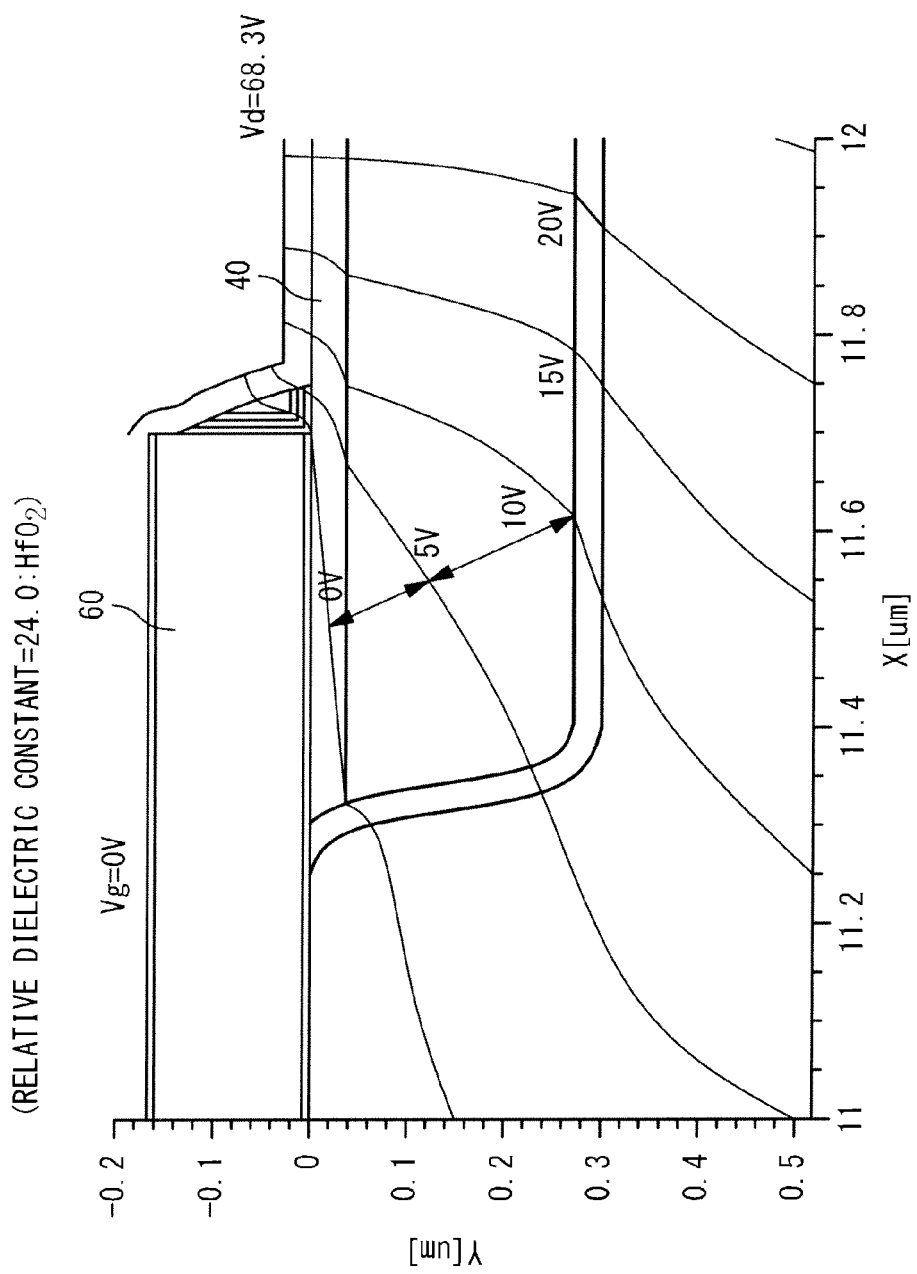

US 8,581,340 B2

SEMICONDUCTOR DEVICE OF WHICH BREAKDOWN VOLTAGE IS IMPROVED

CROSS REFERENCE TO RELATED APPLICATIONS

The present application claims the benefit of patent application number 2010-171078, filed in Japan on Jul. 29, 2010, the subject matter of which is hereby incorporated herein by reference.

BACKGROUND

1. Field of the Invention

The present invention relates to a semiconductor device. In particular, the present invention relates to an LDMOS (Lateral Diffused Metal Oxide Semiconductor) transistor.

2. Description of Related Art

As a high breakdown voltage transistor, an LDMOS transistor is known. In the LDMOS transistor, a thick insulating film, which differs from a gate insulating film, is formed in a semiconductor substrate between a gate electrode and a drain diffusion region. Such an insulator structure formed between a gate and a drain is hereafter referred to as "field drain section". For example, according to a technique described in a patent literature 1 (Japanese patent publication number JP2008-535235A: International publication number WO2006/103634), the field drain section is formed by using the same process as the STI (Shallow Trench Isolation) structure serving as an element isolation structure. A drain-to-substrate breakdown voltage (BVds)) is improved by the foregoing field drain section.

The inventor has now discovered the following facts. According to the consideration of the inventor, it was found that there is room to further research in order to improve the breakdown voltage of the LDMOS transistor. For example, impact ionization is apt to be generated at a boundary between the field drain section and the semiconductor substrate. The impact ionization implies a phenomenon in which many electron-hole pairs are generated by collisions between crystal lattices and electrons accelerated by an electric field. The electron-hole pairs, which are generated by the foregoing impact ionization, disturb the improvement of the drain-to-substrate breakdown voltage BVds. That is, the impact ionization causes the breakdown voltage improvement to be saturated. The breakdown voltage of the LDMOS transistor is desired to be further improved.

SUMMARY

The present invention seeks to solve one or more of the above problems, or to improve upon those problems at least in part.

In one embodiment, a semiconductor device includes: a semiconductor substrate; a gate electrode configured to be formed on the semiconductor substrate through a gate insulating film; a source diffusion layer and a drain diffusion layer configured to be formed on both sides of the gate electrode, respectively, in the semiconductor substrate; and a field drain section configured to be formed below the gate electrode in the semiconductor substrate so as to be positioned between the gate electrode and the drain diffusion region and include an insulator, wherein the field drain section includes: a first insulating film configured to be contact with the semiconductor substrate, and a second insulating film configured to be formed on the first insulating film and has a dielectric constant higher than a dielectric constant of the first insulating film.

According to the present invention, the breakdown voltage of the LDMOS transistor can be further improved.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 4A is an enlarged view of FIG. 3A;

FIG. 4B is an enlarged view of FIG. 3B;

FIG. 4C is an enlarged view of FIG. 3C;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The embodiment of the present invention will be described below with reference to the attached drawings.

1. Structure

Figure 1A:
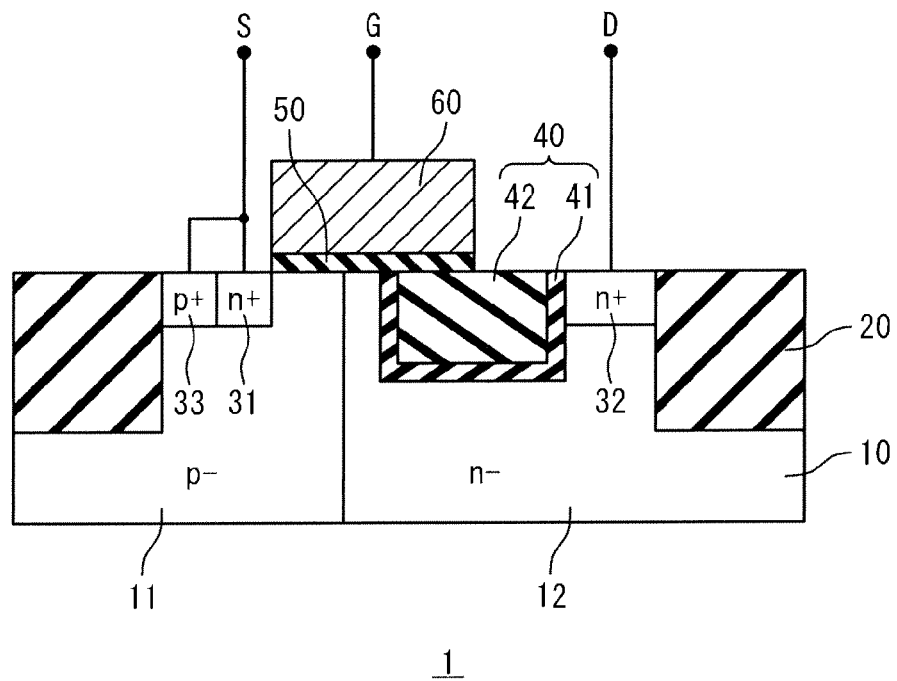
FIG. 1A is a sectional view showing a structure of an LDMOS transistor according to an embodiment of the present invention.
Figure 1B:
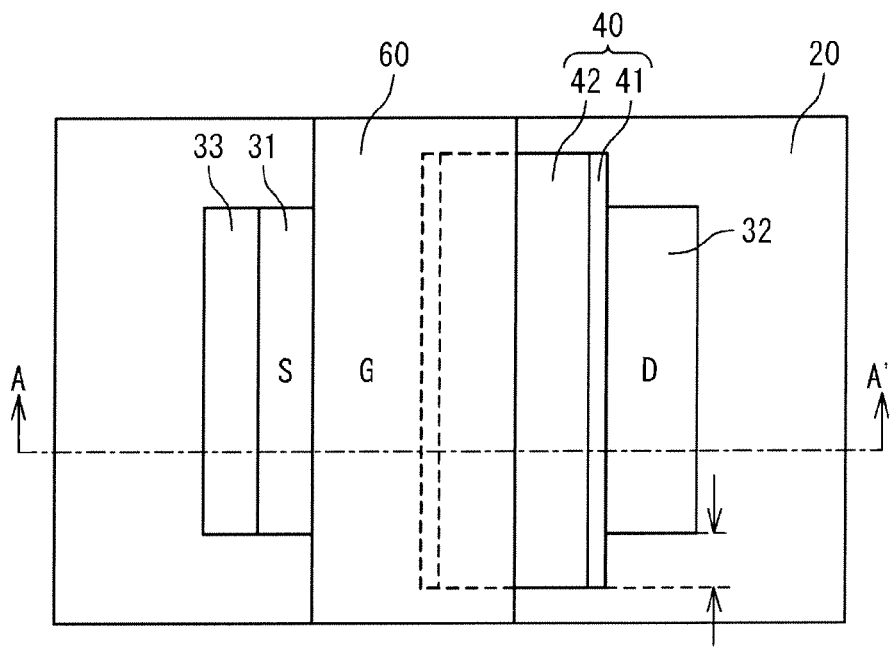
FIG. 1B is a plan view showing the structure of the LDMOS transistor according to the embodiment of the present invention.

FIGS. 1A and 1B show a structure of an LDMOS transistor 1 according to the embodiment of the present invention. FIG. 1B is a plan view, and FIG. 1A is a sectional view along a line A-A' in FIG. 1B. The LDMOS transistor 1 includes a semiconductor substrate 10, an element isolation structure 20, a source diffusion region 31, a drain diffusion region 32, a substrate contact 33, a field drain section 40, a gate insulating film 50 and a gate electrode 60.

The semiconductor substrate 10 is, for example, a silicon substrate. The element isolation structure 20 is formed in the semiconductor substrate 10. The element isolation structure 20 is an insulator structure for electrically isolating elements, and it is typically the STI structure. For example, the element isolation structure 20 is made of silicon oxide film ($SiO_2$ film). A region surrounded with the element isolation structure 20 is an element region.

The source diffusion region 31, the drain diffusion region 32 and the substrate contact 33 are formed in the semiconductor substrate 10 in the element region. The source diffusion region 31 and the drain diffusion region 32 are formed on both sides of the gate electrode 60, respectively. In detail, a $p^-$ well 11 ($p^-$ region) and an $n^-$ well 12 ($n^-$ region) are formed in the semiconductor substrate 10. A boundary between the $p^-$ well 11 and the $n^-$ well 12 is located be low the gate electrode 60. The source diffusion region 31 ($n^+$ region) and the substrate contact 33 ($p^+$ region) are formed in a surface layer of the $p^-$ well 11. On the other hand, the drain diffusion region 32 ($n^+$ region) is formed in a surface layer of the $n^-$ well 12. Incidentally, the drain diffusion region 32 and the gate electrode 60 do not overlap with each other.

The gate electrode 60 is formed through the gate insulating film 50 on a channel region in the semiconductor substrate 10. The gate insulating film 50 is made of, for example, silicon oxide film ($SiO_2$ film). The gate electrode 60 is made of, for example, polysilicon.

The field drain section 40 is the insulator structure provided to improve the breakdown voltage of the LDMOS transistor 1. In detail, the field drain section 40 is formed in the semiconductor substrate 10 in the element region so that it is positioned between the gate electrode 60 and the drain diffusion region 32. In the example of FIG. 1A, the field drain section 40 is formed to be embedded in a trench formed in the $n^-$ well 12. In short, the field drain section 40 is formed in the $n^-$ well 12 to have the STI shape. This field drain section 40 partially overlaps with the gate electrode 60 and is located below the gate electrode 60. Also, the field drain section 40 is in contact with the drain diffusion region 32 and the $n^-$ well 12. Also, by considering a wraparound electric field in a gate width direction, the field drain section 40 is made wider than the diffusion regions (31, 32), as shown in FIG. 1B. Incidentally, the field drain section 40 is structured differently from the element isolation structure 20 and the gate insulating film 50.

According to this embodiment, the field drain section 40 has the structure of at least two layers. In detail, the field drain section 40 includes a first insulating film 41 and a second insulating film 42 that differ from each other. The first insulating film 41 corresponds to an outer layer located on the side of the semiconductor substrate 10 and is in contact with the semiconductor substrate 10 (the $n^-$ well 12 and the drain diffusion region 32). On the other hand, the second insulating film 42 corresponds to an inner layer on the side inner than the first insulating film 41 and is formed on the first insulating film 41. This second insulating film 42 is not in contact with the semiconductor substrate 10 (the $n^-$ well 12 and the drain diffusion region 32).

The first insulating film 41 and the second insulating film 42 are made of materials differing from each other. In particular, the first insulating film 41 and the second insulating film 42 are made of the materials whose dielectric constants differ from each other. Here, a dielectric constant $\in 2$ of the second insulating film 42 is higher than a dielectric constant $\in 1$ of the first insulating film 41 ($\in 2 > \in 1$). For example, a case is considered in which the semiconductor substrate 10 is the silicon substrate and the first insulating film 41 is the silicon oxide film ($SiO_2$ film). A relative dielectric constant of the silicon oxide film is about 3.9. In this case, as the second insulating film 42, for example, silicon nitride film (SiN film; its relative dielectric constant is about 6.0), hafnium oxide film ($HfO_2$ film; its relative dielectric constant is about 24.0) or the like are used. The action and effect that are obtained from such structures are as described below.

2. Action and Effect

Figure 2:
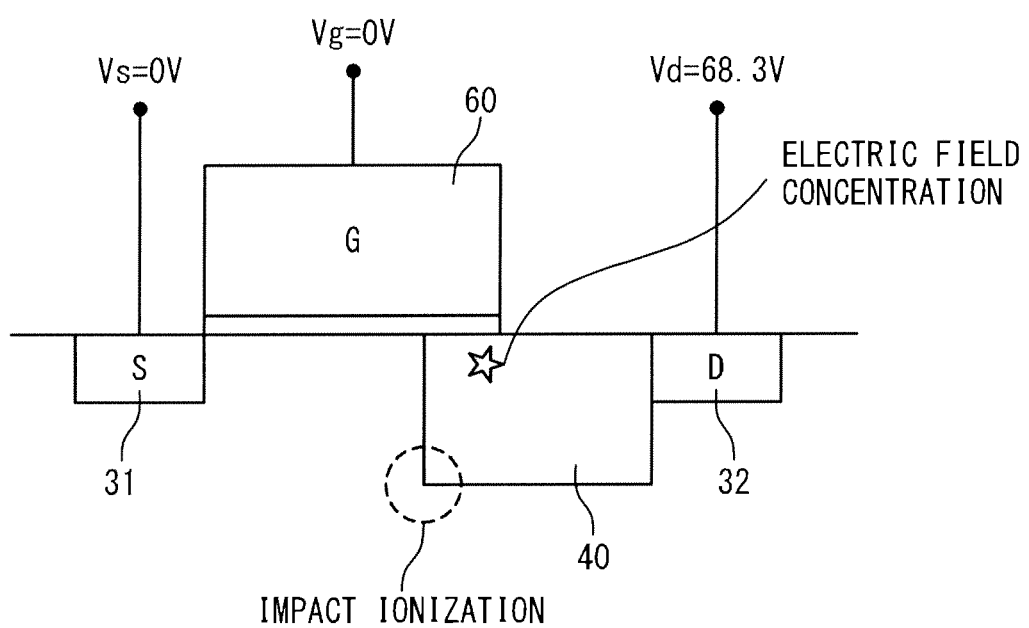
FIG. 2 is a conceptual view describing an action and effect of the embodiment of the present invention.

As shown in FIG. 2, a case is considered in which a gate voltage Vg=0 V is applied to the gate electrode 60, a source voltage Vs=0 V is applied to the source diffusion region 31, and a drain voltage Vd=68.3V is applied to the drain diffusion region 32. At this time, the electric field is apt to be concentrated on the field drain section 40 positioned between the gate electrode 60 and the drain diffusion region 32. The strong electric field resulting from the electric field concentration in the field drain section 40 easily involves the impact ionization on the boundary between the field drain section 40 and the semiconductor substrate 10. The impact ionization implies the phenomenon in which the many electron-hole pairs are generated by the collisions between the crystal lattices and the electrons accelerated by the electric field. The electron-hole pairs generated by the impact ionization as mentioned above disturb the improvement of the drain-to-substrate breakdown voltage BVds.

Conversely, if the electric field concentration in the field drain section 40 can be relaxed, the impact ionization is suppressed, which is considered to result in the improvement of the drain-to-substrate breakdown voltage BVds. The structure according to this embodiment shown in FIGS. 1A and 1B can exactly relax the electric field concentration in the field drain section 40. This fact will be proved with referring to FIGS. 3A to 3C and FIGS. 4A to 4C.

Figure 3A:
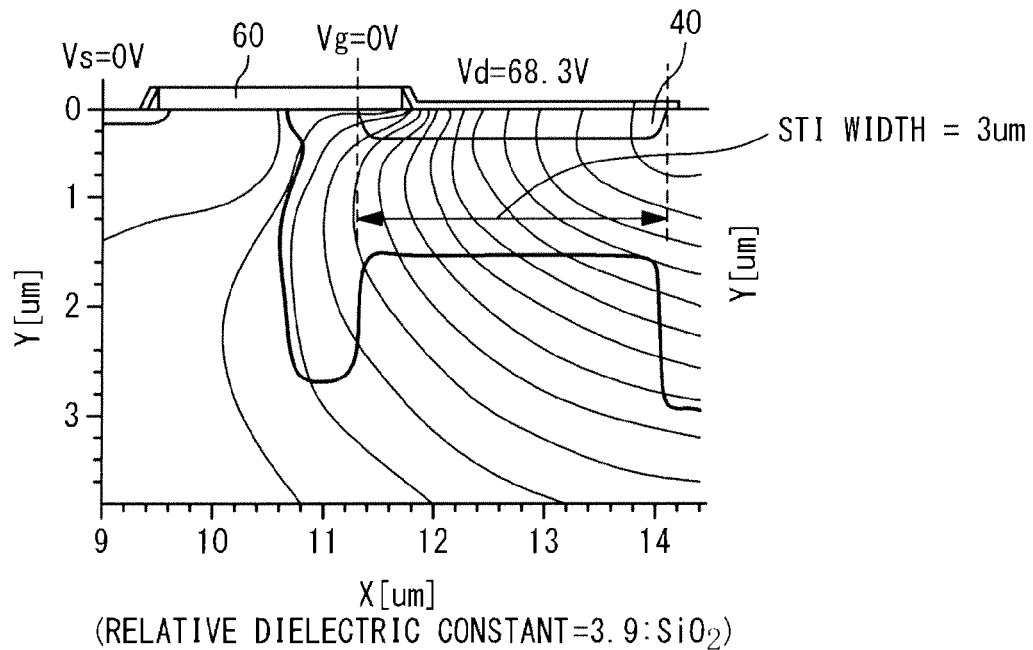
FIG. 3A is a potential diagram describing the action and effect of the embodiment of the present invention.
Figure 3B:
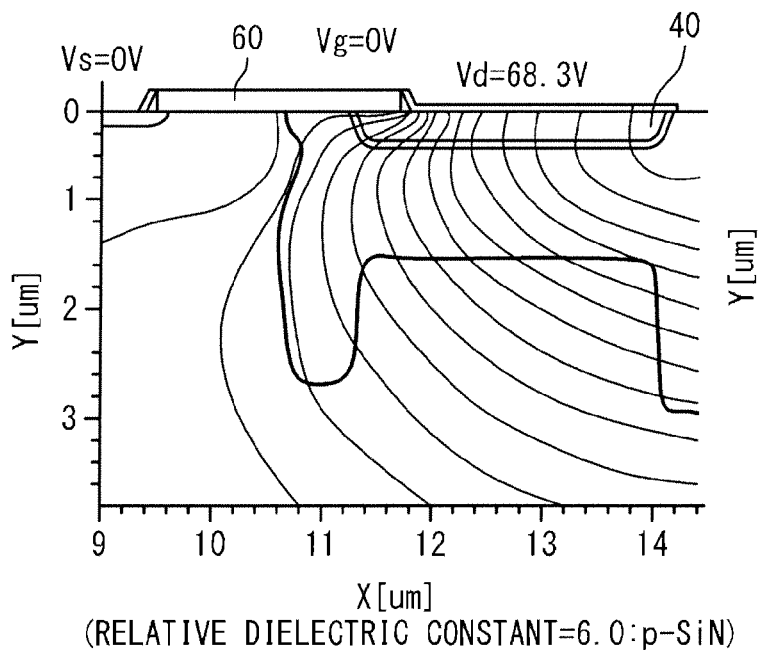
FIG. 3B is a potential diagram describing the action and effect of the embodiment of the present invention.
Figure 3C:
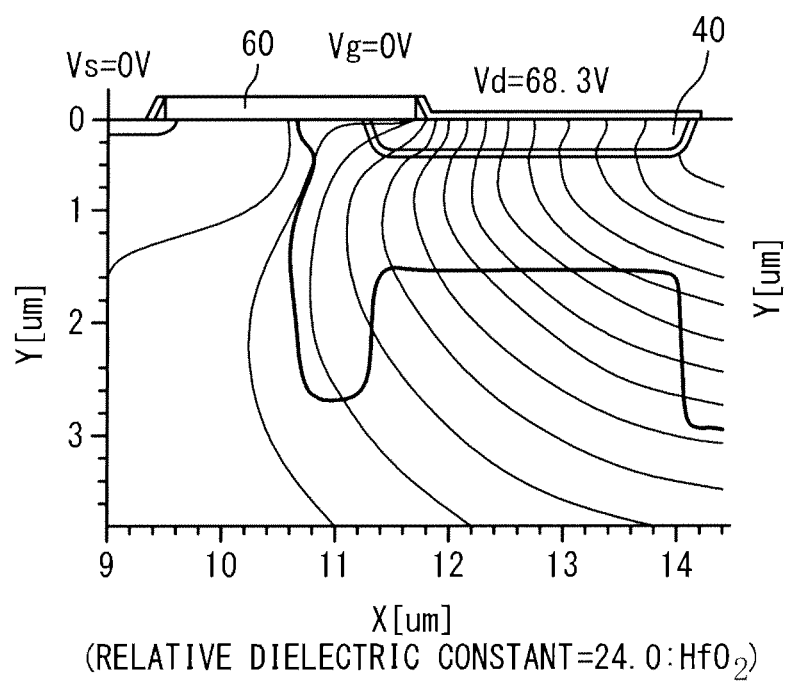
FIG. 3C is a potential diagram describing the action and effect of the embodiment of the present invention.

FIGS. 3A to 3C show potential distributions in the LDMOS transistor 1. FIGS. 4A to 4C are enlarged views of FIGS. 3A to 3C, respectively, showing potential distributions in the vicinity of the field drain section 40. FIGS. 3A and 4A show the case of a comparison example. In this case, the field drain section 40 is entirely made of $SiO_2$ (its relative dielectric constant is 3.9). FIGS. 3B and 4B show the case of this embodiment. In this case, the first insulating film 41 is made of $SiO_2$ (its relative dielectric constant is 3.9) and the second insulating film 42 is made of SiN (its relative dielectric constant is 6.0). FIGS. 3C and 4C show the case of this embodiment. In this case, the first insulating film 41 is made of $SiO_2$ (its relative dielectric constant is 3.9), and the second insulating film 42 is made of $HfO_2$ (its relative dielectric constant is 24.0). Here, a width of the field drain section 40 is set to 3 μm (refer to FIG. 3A).

As can be understood from FIGS. 4A to 4C, according to this embodiment, a slope of the potential in the field drain section 40 is more gradual than that in the case of the comparison example (FIG. 4A). That is, according to this embodiment, the electric field concentration in the field drain section 40 is relaxed. In particular, it is found that the electric field concentration is relaxed in the vicinity of the boundary between the field drain section 40 and the semiconductor substrate 10, where the impact ionization is apt to be generated. Moreover, it is found that as the dielectric constant of the second insulating film 42 is higher, the electric field concentration is further relaxed. Since the electric field concentration in the field drain section 40 is relaxed, the impact ionization is suppressed, which results in the improvement of the drain-to-substrate breakdown voltage BVds.

Figure 5:
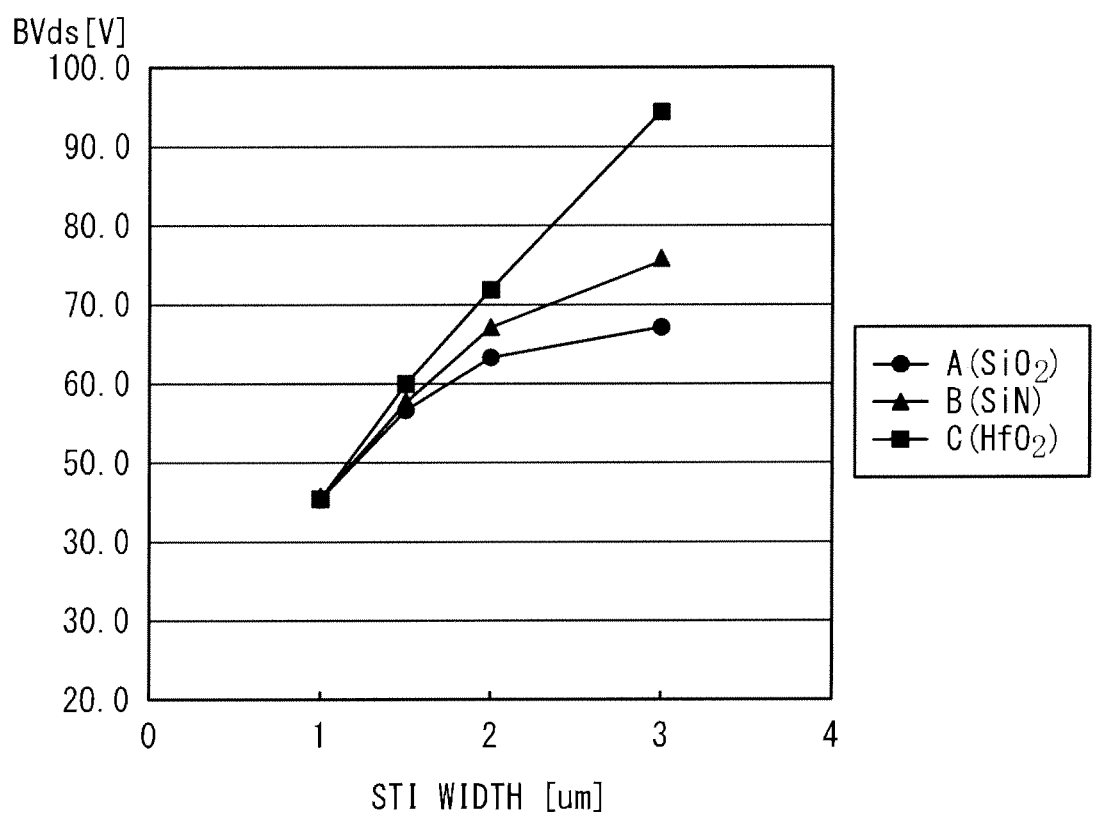
FIG. 5 is a graph showing a drain-to-substrate breakdown voltage (BVds) in order to describe the action and effect of the embodiment of the present invention.

FIG. 5 shows the drain-to-substrate breakdown voltage BVds in each of the cases of FIGS. 4A to 4C. In FIG. 5, a vertical axis represents the drain-to-substrate breakdown voltage BVds, and a horizontal axis represents the width of the field drain section 40. The width of the field drain section 40 corresponds to a separation distance between the gate electrode 60 and the drain diffusion region 32. Typically, as the separation distance between the gate electrode 60 and the drain diffusion region 32 is longer, the breakdown voltage is considered to be improved. However, in the case of the comparison example ("A" in the graph), as the separation distance is longer, the drain-to-substrate breakdown voltage BVds begins to exhibit the sign of a limit. In short, in the case of the comparison example, the breakdown voltage improvement is saturated. This is considered to be caused by the impact ionization.

On the other hand, according to this embodiment ("B" and "C" in the graph), the drain-to-substrate breakdown voltage BVds is improved as compared with the case of the comparison example. This is because the impact ionization is suppressed. As the separation distance between the gate electrode 60 and the drain diffusion region 32 is longer, the drain-to-substrate breakdown voltage BVds is preferably increased without being saturated. As the dielectric constant of the second insulating film 42 is higher and the separation distance is longer, its effect is more evident.

As another comparison example, a case is considered in which there is not the first insulating film 41 of this embodiment, namely, the field drain section 40 is formed of only the second insulating film 42 with the high dielectric constant. For example, it is assumed that the field drain section 40 is formed of only the silicon nitride film (SiN film) with the high dielectric constant. When the gate insulating film 50 ($SiO_2$ film) is brought into contact with the SiN film, which is a different kind from $SiO_2$ film, interface states are generated on the boundary between them. When there is not the first insulating film 41, hot carriers accelerated by a drain electric field are trapped at the interface states. This leads to deterioration of the long-term reliability of the LDMOS transistor 1. From such a viewpoint, the first insulating film 41 ($SiO_2$ film) made of the same material as the gate insulating film 50 is preferably formed outside the second insulating film 42. Thus, the long-term reliability is improved.

Also, during a thermal treatment in a manufacturing step, stress is generated by a difference between a thermal expansion coefficient of the field drain section 40 and a thermal expansion coefficient of the diffusion region in contact therewith. When the stress is great, there is a possibility that a crystal defect is generated at the boundary between the field drain section 40 and the diffusion region. Such a crystal defect causes a leakage current. When there is not the first insulating film 41 in this embodiment, the second insulating film 42 (SiN film) is in direct contact with the diffusion region in the semiconductor substrate 10. In this case, the difference of the thermal expansion coefficient is greater than that in the case where the first insulating film 41 ($SiO_2$ film) exists as an interface. In short, when the first insulating film 41 does not exist, the crystal defect is generated, which increases a tendency that the leakage current is increased. From such a viewpoint, it is preferable to form the first insulating film 41 ($SiO_2$ film) as the interface to the semiconductor substrate 10 (silicon substrate). Consequently, the generation of the crystal defect can be suppressed, and the leakage current can be decreased.

As still another comparison example, a case is considered in which even the element isolation structure 20 has the high dielectric constant film similar to the field drain section 40 according to this embodiment. For example, it is assumed that the element isolation structure 20 includes a SiN film with a high dielectric constant. In this case, a parasitic capacitance of a wiring line (for example, a gate wiring line) overlapping with the element isolation structure 20 is increased, as compared with the case in which the element isolation structure 20 is entirely made of the $SiO_2$ film. The foregoing increase in the parasitic capacitance leads to reduction of a circuit operation speed. From such a viewpoint, it is preferred that the element isolation structure 20 according to this embodiment is made of a third insulating film with a lower dielectric constant than that of the second insulating film 42 which has the high dielectric constant. For example, the element isolation structure 20 is entirely made of the $SiO_2$ film. Consequently, the increase in the parasitic capacitance of the wiring line overlapping with the element isolation structure 20 can be avoided, whereby preventing the circuit operation speed from being reduced.

3. Manufacturing Method

The manufacturing method of the LDMOS transistor 1 according to this embodiment will be described below.

Figure 6A:
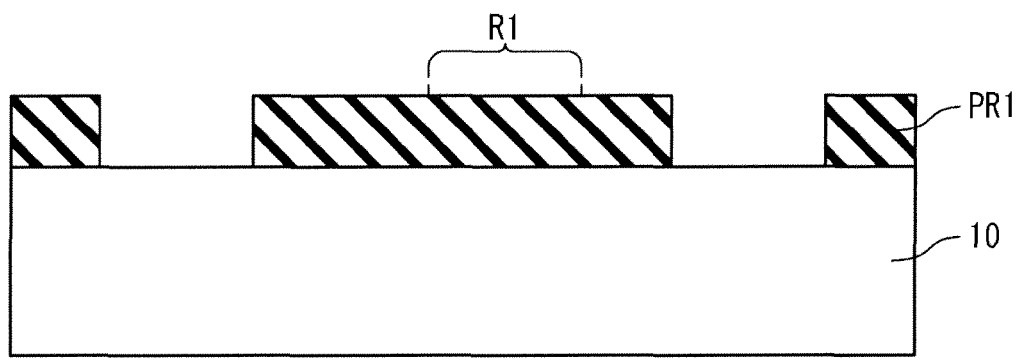
FIG. 6A is a sectional view showing a manufacturing step of the LDMOS transistor according to the embodiment of the present invention.

At first, as shown in FIG. 6A, a resist mask PR1 is formed on the semiconductor substrate 10 (e.g., silicon substrate). This resist mask PR1 has an opening in a region where the element isolation structure 20 is formed. Here, in FIG. 6A, a region R1 indicates a region where the field drain section 40 will be formed. As shown in FIG. 6A, note that the resist mask PR1 covers the region R1.

Figure 6B:
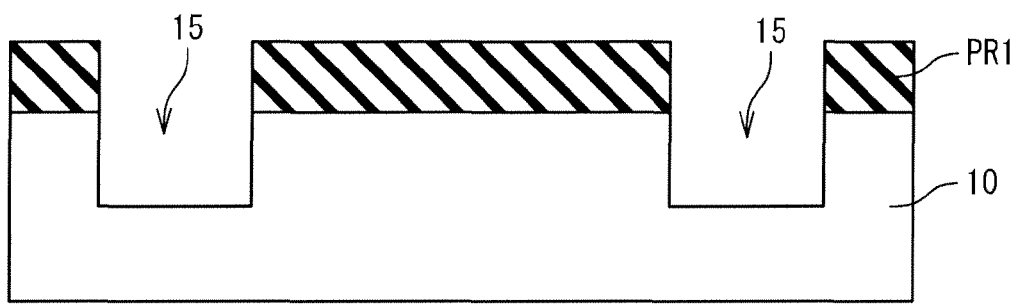
FIG. 6B is a sectional view showing the manufacturing step of the LDMOS transistor according to the embodiment of the present invention.

Next, the resist mask PR1 is used to execute a trench etching. Then, as shown in FIG. 6B, trenches 15 are formed in the semiconductor substrate 10. This trench 15 is used for the element isolation structure 20.

Figure 6C:
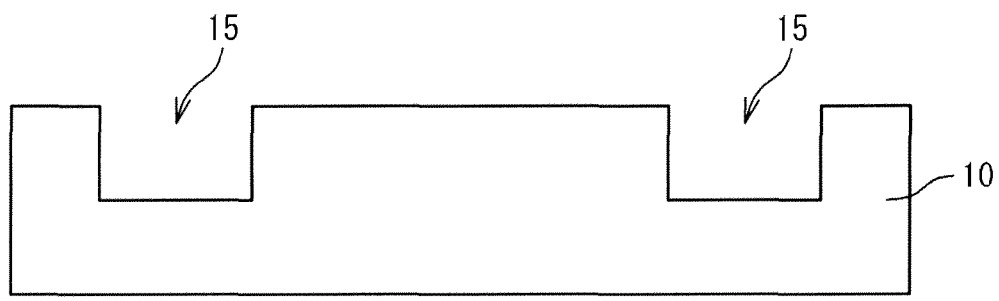
FIG. 6C is a sectional view showing the manufacturing step of the LDMOS transistor according to the embodiment of the present invention.

In succession, the resist mask PR1 is removed. As a result, the structure shown in FIG. 6C is obtained.

Figure 6D:
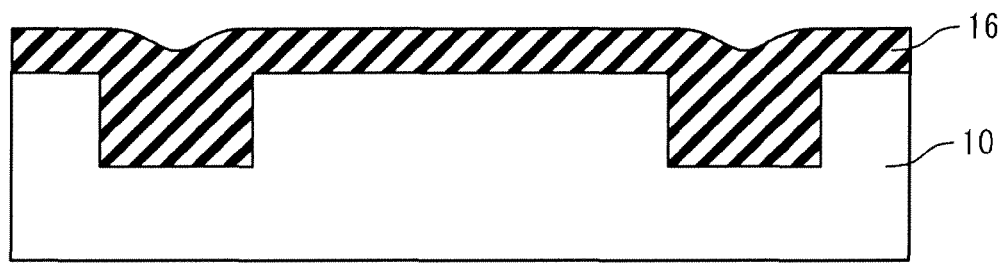
FIG. 6D is a sectional view showing the manufacturing step of the LDMOS transistor according to the embodiment of the present invention.

Next, as shown in FIG. 6D, after the execution of rounding oxidation, a CVD (chemical vapor deposition) method is used to form an insulating material film 16 on the entire surface. This insulating material film 16 is used for the element isolation structure 20, and it is, for example, the $SiO_2$ film.

Figure 6E:
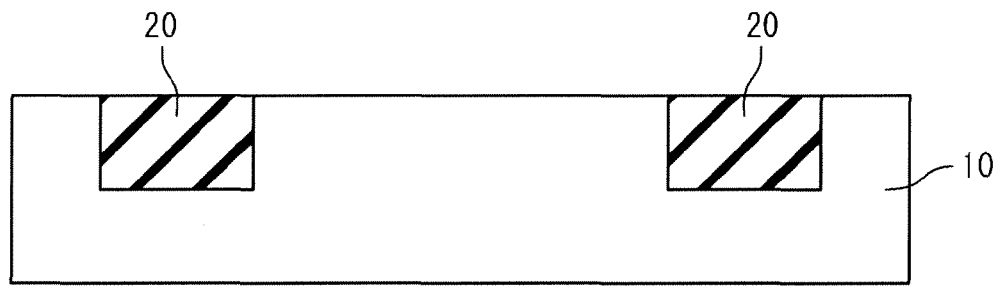
FIG. 6E is a sectional view showing the manufacturing step of the LDMOS transistor according to the embodiment of the present invention.

Next, CMP (chemical mechanical polishing) is executed. As a result, as shown in FIG. 6E, the element isolation structure 20 is formed so as to be embedded in the trenches 15.

Figure 6F:
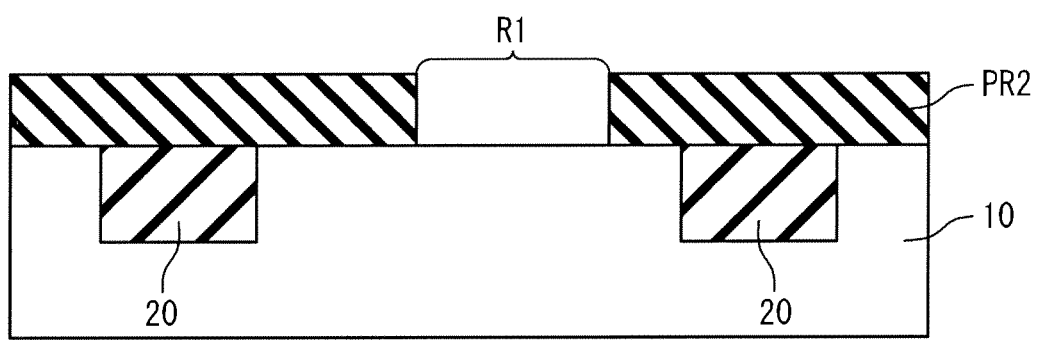
FIG. 6F is a sectional view showing the manufacturing step of the LDMOS transistor according to the embodiment of the present invention.

Next, as shown in FIG. 6F, a resist mask PR2 having an opening in the predetermined region R1 is formed on the semiconductor substrate 10. This predetermined region R1 corresponds to the region where the field drain section 40 will be formed.

Figure 6G:
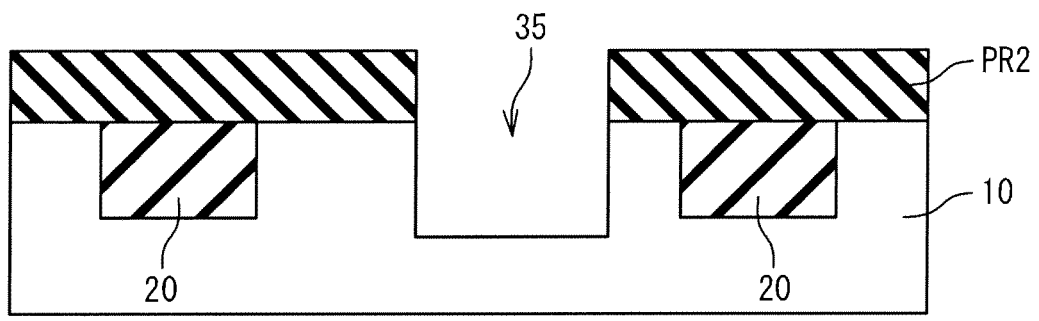
FIG. 6G is a sectional view showing the manufacturing step of the LDMOS transistor according to the embodiment of the present invention.

Next, the resist mask PR2 is used to execute the trench etching. Then, as shown in FIG. 6G, a trench 35 is formed in the semiconductor substrate 10 in the region R1. This trench 35 is used for the field drain section 40.

Figure 6H:
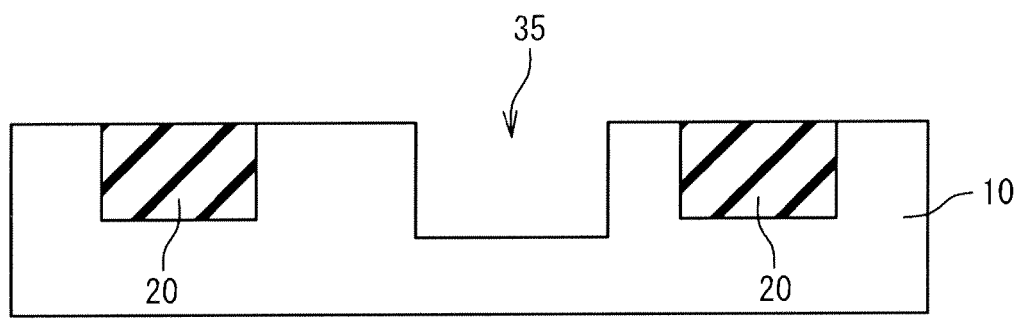
FIG. 6H is a sectional view showing the manufacturing step of the LDMOS transistor according to the embodiment of the present invention.

In succession, the resist mask PR2 is removed. As a result, the structure shown in FIG. 6H is obtained.

Figure 6I:
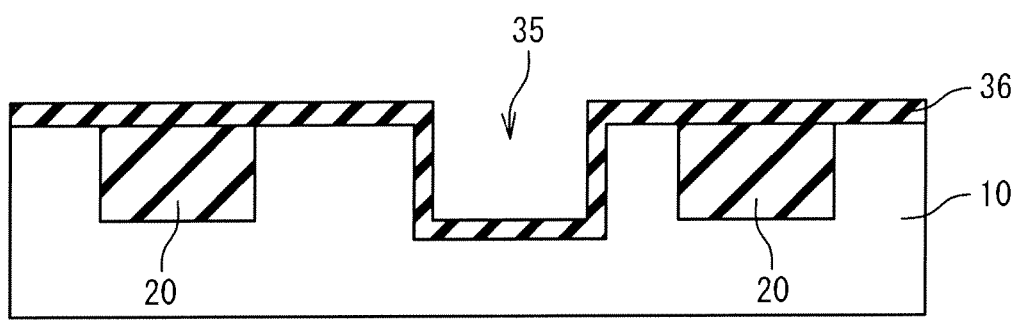
FIG. 6I is a sectional view showing the manufacturing step of the LDMOS transistor according to the embodiment of the present invention.

Next, as shown in FIG. 6I, a first insulating material film 36 is formed on the entire surface. This first insulating material film 36 is used for the first insulating film 41 in the field drain section 40, and it is, for example, the SiO$_2$ film. For example, the first insulating material film 36 is made by the thermal oxidation (rounding oxidation) or the CVD method. Note that this first insulating film 41 covers the surface of the semiconductor substrate 10 exposed in the trench 35.

Figure 6J:
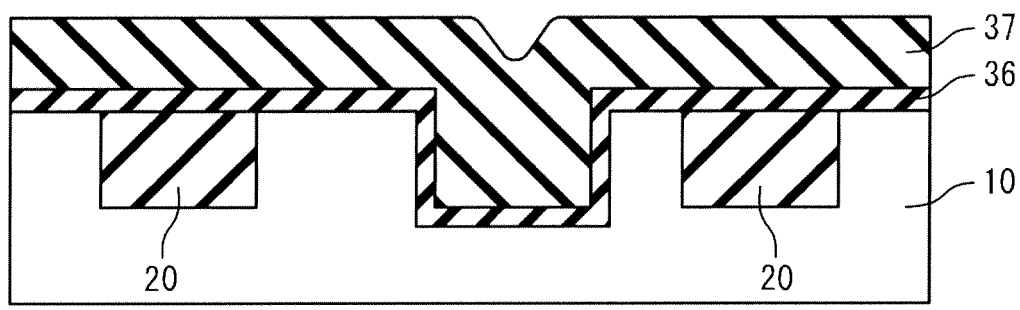
FIG. 6J is a sectional view showing the manufacturing step of the LDMOS transistor according to the embodiment of the present invention.

In succession, as shown in FIG. 6J, a second insulating material film 37 is formed on the entire surface by the CVD method. This second insulating material film 37 is formed on the first insulating material film 36 so that the inside of the trench 35 is embedded. This second insulating material film 37 is used for the second insulating film 42 in the field drain section 40, and its dielectric constant ∈2 is higher than the dielectric constant ∈1 of the first insulating material film 36. For example, when the first insulating material film 36 is the SiO$_2$ film (its relative dielectric constant is about 3.9), the SiN film (its relative dielectric constant is about 6.0) and the HfO$_2$ film (its relative dielectric constant is about 24.0) are listed as the second insulating material film 37.

Figure 6K:
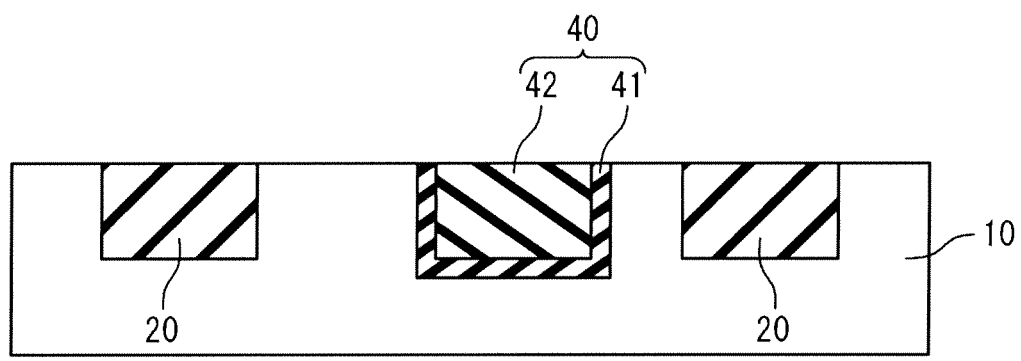
FIG. 6K is a sectional view showing the manufacturing step of the LDMOS transistor according to the embodiment of the present invention.

Next, the CMP method is executed to remove the unnecessary second insulating material film 37 and first insulating material film 36. As a result, as shown in FIG. 6K, the field drain section 40 is formed so as to be embedded in the trench 35. The field drain section 40 has the first insulating film 41 in contact with the semiconductor substrate 10 and the second insulating film 42 of the high dielectric constant formed on the first insulating film 41.

After that, the process similar to the case of the typical LDMOS transistor forms the gate insulating film 50, the gate electrode 60, the source diffusion region 31, the drain diffusion region 32, the substrate contact 33 and the like. In this way, the LDMOS transistor shown in FIGS. 1A and 1B is completed.

It is apparent that the present invention is not limited to the above embodiment, but may be modified and changed without departing from the scope and spirit of the invention.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. A semiconductor device comprising:
a semiconductor substrate;
a gate electrode configured to be formed on said semiconductor substrate through a gate insulating film;
a source diffusion layer and a drain diffusion layer configured to be formed on both sides of said gate electrode, respectively, in said semiconductor substrate; and
a field drain section configured to be formed below said gate electrode in said semiconductor substrate so as to be positioned between said gate electrode and said drain diffusion region,
wherein said field drain section includes:
a first insulating film configured to be in contact with said semiconductor substrate,
a second insulating film configured to be formed on said first insulating film and having a dielectric constant higher than a dielectric constant of silicon nitride,
wherein said field drain section is wider than said drain diffusion layer.

2. The semiconductor device according to claim 1, wherein said first insulating film and said gate insulating film are made of a same material.

3. The semiconductor device according to claim 1, wherein said semiconductor substrate includes a silicon substrate, and wherein said first insulating film includes a silicon oxide film.

4. The semiconductor device according to claim 1, further comprising:
an element isolation structure configured to be formed in said semiconductor substrate,
wherein said element isolation structure is made of a third insulating film having a dielectric constant lower than said dielectric constant of said second insulating film.

5. The semiconductor device according to claim 4, wherein said semiconductor substrate includes a silicon substrate,
wherein said first insulating film and said third insulating film include silicon oxide films.

6. The semiconductor device according to claim 3, wherein said second insulating film includes one of a silicon nitride film and a hafnium oxide.

7. The semiconductor device according to claim 5, wherein said second insulating film includes one of a silicon nitride film and a hafnium oxide.

8. The semiconductor device according to claim 1, wherein said field drain section partially overlaps with said gate electrode and is located below said gate electrode.

9. The semi conductor device according to claim 1, wherein a thermal expansion coefficient of said first insulating film is closer to a thermal expansion coefficient of said semiconductor substrate than a thermal expansion coefficient of said second insulating film.

10. The semiconductor device according to claim 6, wherein said second insulating film includes hafnium oxide.

11. The semiconductor device according to claim 7, wherein said second insulating film includes hafnium oxide.

12. The semiconductor device according to claim 1, wherein said second insulating film includes hafnium oxide.

13. A semiconductor device comprising:
a gate electrode formed on a semiconductor substrate through a gate insulating film;
a source diffusion layer and a drain diffusion layer formed on both sides of the gate electrode, respectively, in the semiconductor substrate; and
a field drain section formed below the gate electrode and partially overlapped with the gate electrode so as to be positioned between the gate electrode and the drain diffusion region,
wherein said field drain section includes:
a first insulating film being in contact with the semiconductor substrate, and
a second insulating film formed on the first insulating film and having a dielectric constant higher than a dielectric constant of silicon nitride.

14. The semiconductor device according to claim 13, wherein the second insulating film includes hafnium oxide.

15. The semiconductor device according to claim 13, further comprising:
an element isolation structure formed in the semiconductor substrate,
wherein the element isolation structure includes a third insulating film having a dielectric constant lower than the dielectric constant of the second insulating film.

16. The semiconductor device according to claim 13, further comprising:
an element isolation structure formed in the semiconductor substrate and having a different structure from the field drain section such that the element isolation structure includes a third insulating film having a dielectric constant lower than the dielectric constant of the second insulating film.

17. The semiconductor device according to claim 16, wherein the second insulating film includes hafnium oxide.

18. The semiconductor device according to claim 15, wherein the second insulating film includes hafnium oxide.

* * * * *